United States Patent
Limbeck et al.

(10) Patent No.: US 9,127,894 B2
(45) Date of Patent: Sep. 8, 2015

(54) DEVICE HAVING A HEAT EXCHANGER FOR A THERMOELECTRIC GENERATOR OF A MOTOR VEHICLE AND MOTOR VEHICLE HAVING THE DEVICE

(71) Applicant: EMITEC GESELLSCHAFT FUER EMISSIONSTECHNOLOGIE MBH, Lohmar (DE)

(72) Inventors: Sigrid Limbeck, Much (DE); Rolf Brueck, Bergisch Gladbach (DE)

(73) Assignee: EMITEC Gesellschaft fuer Emissiontechnologie mbH, Lohmar (DE)

( * ) Notice: Subject to any disclaimer, the term of this patent is extended or adjusted under 35 U.S.C. 154(b) by 50 days.

(21) Appl. No.: 14/053,767

(22) Filed: Oct. 15, 2013

(65) Prior Publication Data

US 2014/0033703 A1    Feb. 6, 2014

Related U.S. Application Data

(63) Continuation of application No. PCT/EP2012/056407, filed on Apr. 10, 2012.

(30) Foreign Application Priority Data

Apr. 13, 2011    (DE) .......................... 10 2011 016 808

(51) Int. Cl.
   *F01N 3/02*    (2006.01)
   *F01N 5/02*    (2006.01)
   (Continued)

(52) U.S. Cl.
   CPC . *F28F 1/00* (2013.01); *F01N 3/043* (2013.01); *F01N 5/02* (2013.01); *F01N 5/025* (2013.01);
   (Continued)

(58) Field of Classification Search
   CPC ........... F01N 3/043; F01N 5/02; F01N 5/025; F01N 2240/02; F01N 2240/36; F01N 2260/14; F01N 2410/00; F01N 2410/02; F01N 2470/08; F01N 2470/24; F28D 7/1669; F28D 21/0003; F28F 1/00; F02G 5/02; H01L 35/30; Y02T 10/16; Y02T 10/166; Y02T 10/20
   USPC ........................... 60/320; 165/104.11, 104.19
   See application file for complete search history.

(56) References Cited

U.S. PATENT DOCUMENTS 6,857,468 B2    2/2005    Emrich
7,150,147 B2    12/2006    Murata
(Continued)

FOREIGN PATENT DOCUMENTS

DE          10355649 A1    12/2005
DE       102005039794 A1    3/2007
(Continued)

OTHER PUBLICATIONS

International Search Report of PCT/EP2012/056407, Dated Oct. 10, 2012.

*Primary Examiner* — Audrey K Bradley
(74) *Attorney, Agent, or Firm* — Laurence A. Greenberg; Werner H. Stemer; Ralph E. Locher

(57) ABSTRACT

A device having a heat exchanger includes a housing having a first end side and a second end side disposed along an axial direction, an inlet at the first end side and an outlet at the second end side for a fluid, a first annular channel connected to the inlet and a second annular channel upstream of the outlet, at least one outer jacket tube and at least one inner jacket tube disposed mutually concentrically and defining an intermediate space therebetween, a plurality of flow paths for the fluid extending in the axial direction in the intermediate space and interconnecting the first channel and the second channel, and at least one heat exchanger tube disposed in each of the plurality of flow paths. A motor vehicle having the device is also provided.

7 Claims, 2 Drawing Sheets

(51) Int. Cl.
  *F28D 15/00* (2006.01)
  *F28F 1/00* (2006.01)
  *F01N 3/04* (2006.01)
  *F02G 5/02* (2006.01)
  *H01L 35/30* (2006.01)
  *F28D 7/16* (2006.01)
  *F28D 21/00* (2006.01)

(52) U.S. Cl.
  CPC  *F02G 5/02* (2013.01); *H01L 35/30* (2013.01); *F01N 2240/02* (2013.01); *F01N 2240/36* (2013.01); *F01N 2260/14* (2013.01); *F01N 2410/00* (2013.01); *F01N 2410/02* (2013.01); *F01N 2470/08* (2013.01); *F01N 2470/24* (2013.01); *F28D 7/1669* (2013.01); *F28D 21/0003* (2013.01); *Y02T 10/16* (2013.01); *Y02T 10/166* (2013.01); *Y02T 10/20* (2013.01)

(56) References Cited

U.S. PATENT DOCUMENTS

| | | |
|---|---|---|
| 7,921,640 B2 | 4/2011 | Major |
| 8,327,634 B2 | 12/2012 | Orihashi et al. |
| 8,443,593 B2 | 5/2013 | Sloss et al. |
| 8,448,429 B2 | 5/2013 | Fukudome et al. |
| 8,461,447 B2 | 6/2013 | Polcyn |
| 8,656,710 B2 | 2/2014 | Bell et al. |
| 2005/0133202 A1* | 6/2005 | Jorgensen et al. ............ 165/103 |
| 2008/0028769 A1 | 2/2008 | Goenka |
| 2009/0049832 A1 | 2/2009 | Hase |
| 2010/0043413 A1* | 2/2010 | Orihashi et al. ................ 60/320 |
| 2011/0120106 A1 | 5/2011 | Brück et al. |
| 2011/0258995 A1 | 10/2011 | Limbeck et al. |

FOREIGN PATENT DOCUMENTS

| | | |
|---|---|---|
| EP | 2196648 A1 | 6/2010 |
| EP | 2288796 B1 | 12/2011 |
| JP | 0936439 | 2/1997 |
| JP | H10281014 A | 10/1998 |
| JP | 2000018095 A | 1/2000 |
| JP | 2008144595 A | 6/2008 |
| JP | 2010031671 A | 2/2010 |
| JP | 2010163899 A | 7/2010 |
| WO | 9632572 A1 | 10/1996 |
| WO | 2004059139 A1 | 7/2004 |
| WO | 2008028769 A1 | 3/2008 |
| WO | 2008068632 A2 | 6/2008 |
| WO | 2009082534 A2 | 7/2009 |
| WO | 2010057578 A2 | 5/2010 |
| WO | 2010067196 A2 | 6/2010 |
| WO | 2011011795 A2 | 1/2011 |

* cited by examiner

DEVICE HAVING A HEAT EXCHANGER FOR A THERMOELECTRIC GENERATOR OF A MOTOR VEHICLE AND MOTOR VEHICLE HAVING THE DEVICE

CROSS-REFERENCE TO RELATED APPLICATION

This is a continuation, under 35 U.S.C. §120, of copending International Application No. PCT/EP2012/056407, filed Apr. 10, 2012, which designated the United States; this application also claims the priority, under 35 U.S.C. §119, of German Patent Application DE 10 2011 016 808.7, filed Apr. 13, 2011; the prior applications are herewith incorporated by reference in their entirety.

BACKGROUND OF THE INVENTION

Field of the Invention

The present invention relates to a device having a heat exchanger for a thermoelectric generator, in particular for installation in a motor vehicle. The invention also relates to a motor vehicle having the device.

The exhaust gas from an internal combustion engine of a motor vehicle contains thermal energy, and it is the intention for the thermal energy to be converted into electrical energy by using a thermoelectric generator, for example in order to charge a battery or some other energy storage device and/or to supply required energy directly to electrical consumers. In that way, a greater amount of energy is made available for the operation of the motor vehicle. The energy efficiency of an internal combustion engine is further increased through the use of a thermoelectric generator.

A thermoelectric generator of that type has at least a multiplicity of, if appropriate modular, thermoelectric converter elements. Thermoelectric materials are materials which can convert thermal energy into electrical energy (Seebeck effect) and vice versa (Peltier effect) in an effective manner. The Seebeck effect is based on the phenomenon of the conversion of thermal energy into electrical energy and is utilized for generating thermoelectric energy. The Peltier effect is the reverse of the Seebeck effect and is a phenomenon associated with heat adsorption and which is generated in relation to a current flow through different materials. The Peltier effect has already been proposed, for example, for thermoelectric cooling.

Such thermoelectric converter elements preferably have a multiplicity of thermoelectric elements which are positioned between a so-called hot side and a so-called cold side. Thermoelectric elements include, for example, at least two semiconductor blocks (p-type and n-type), which on their upper and lower sides (respectively facing the hot side and the cold side) are alternately connected to electrically conductive bridges. Ceramic plates or ceramic coatings or plastics and/or similar materials serve for insulating the metal bridges and are thus preferably disposed between the metal bridges. If a temperature gradient is provided on both sides of the semiconductor blocks, a voltage potential is formed. In that case heat is absorbed at one contact point (hot side), with the electrons passing from the one side to the higher-energy conduction band of the following block. On the other side the electrons can now release energy in order to return to a lower energy level (cold side). A current flow can thus occur given a corresponding temperature gradient.

A wide variety of challenges must be overcome in the construction of thermoelectric generators and in the use thereof in a motor vehicle. Among other things, good heat transfer must be provided within the thermoelectric converter elements in such a way that temperature differences present can be efficiently converted for conversion into electrical energy. Furthermore, in an internal combustion engine exhaust system, which operates under a wide variety of load conditions, a temperature level which is suitable for the thermoelectric elements must be provided. The configuration of the thermoelectric elements within such a device or an exhaust system must also be considered with regard to those aspects.

SUMMARY OF THE INVENTION

It is accordingly an object of the invention to provide a device having a heat exchanger for a thermoelectric generator of a motor vehicle and a motor vehicle having the device, which overcome the hereinafore-mentioned disadvantages and at least partially solve the highlighted problems of the heretofore-known devices and motor vehicles of this general type. In particular, it is sought to specify a device which exhibits high efficiency in the conversion of thermal energy from exhaust gas into electrical energy. Furthermore, the device should have as space-saving a construction as possible and be suitable, in particular, for placement in the region of the underbody of a motor vehicle. Additionally, retroactive installation of the device into a motor vehicle should be possible without the need for cumbersome measures for integration.

With the foregoing and other objects in view there is provided, in accordance with the invention, a device having a heat exchanger, in particular for installation in an exhaust system of an internal combustion engine in a motor vehicle, the heat exchanger comprising a housing with an inlet disposed along an axial direction on a first end side, and an outlet disposed on a second (opposite) end side, for a fluid. Furthermore, the heat exchanger has at least one outer shell tube and an inner shell tube disposed concentrically with respect thereto and has an annular first duct which (directly) adjoins the inlet and an annular second duct disposed (directly) upstream of the outlet. The first duct and the second duct are connected by a multiplicity of flow paths for the fluid which extend in the axial direction in an (annular) intermediate space between the inner shell tube and the outer shell tube. In each case at least one heat exchanger is disposed in the multiplicity of flow paths. Therefore, the fluid flows into the annular first duct through the inlet and is subsequently conducted to the annular second duct through the multiplicity of flow paths. The fluid subsequently exits the housing through the outlet.

The housing, or the inner and/or outer shell tube, preferably has a round, in particular circular or elliptical/oval shape, but is in no way restricted to such a shape. The intermediate space which surrounds the flow paths is formed by the outer shell tube and the inner shell tube. The inner shell tube surrounds a cavity. The inlet and the outlet are, in particular, cylindrical and connected to the exhaust line of an internal combustion engine. The fluid (for example an exhaust gas of the internal combustion engine) flows from the exhaust line into the annular first duct and is transferred through the first duct into the (annular) intermediate space between the outer and inner shell tubes. In particular, the annular first duct at least partially surrounds the inlet. The first duct may, however, also have a cylindrical form and may directly adjoin the inlet, in such a way that the fluid flows into the annular intermediate space through the first duct.

In a preferred refinement of the device, at least one flow path does not have a heat exchanger tube. The flow path thus serves as a bypass which can be charged with the fluid by using a control element which is disposed, for example, in the first annular duct and/or in the inlet. It is preferably possible for the entire fluid stream to be conducted past the heat exchanger tubes through the bypass. This is necessary, in particular, when the exhaust-gas temperature is too high, so that the heat exchanger tubes cannot be adequately cooled, or when no additional burden should be placed on a coolant supply. Furthermore, it is thus also possible for the introduction of heat at exhaust-gas treatment components disposed downstream to be controlled in that only one controllable heat loss occurs as a result of the flow over the heat exchanger tubes. The thermal energy thus remains stored in the fluid and is first dissipated downstream of the heat exchanger to additionally provided exhaust-gas treatment components in an exhaust line. The control and/or adjustment of the flow through the bypass is preferably performed while taking into consideration the operating point of the internal combustion engine and/or taking into consideration characteristic values of the fluid (temperature, pressure, fluid composition).

In accordance with another advantageous feature of the device of the invention, the thermoelectric elements are provided in the heat exchanger tubes. In this case, the thermoelectric elements are, in particular, stacked one on top of the other in annular form in the axial direction of the heat exchanger tube. The hot fluid (exhaust gas) flows over the heat exchanger tubes at the outside, and a cooling fluid (water) flows through the heat exchanger tubes in an inner duct. As a result of the temperature gradient thus generated between the outer surface and an inner duct of the heat exchanger tube, the electrically connected thermoelectric elements generate an electrical current which can be tapped off on the housing of the heat exchanger through suitable electrical terminals. The device with the heat exchanger is thus operated as a thermoelectric generator which is, in particular, connected to electrical storage devices or electrical consumers of the motor vehicle in such a way that, in this way, the current generated by the thermoelectric generator can be made available to the motor vehicle.

Consideration is given, in particular, to the following as thermoelectric materials for the thermoelectric elements:

n-type thermoelectric material: Silicides (for example MgSi—MgSn)

p-type thermoelectric material: Zintl-phases (for example $Zn_4Sb_4$)

These materials have proven to be particularly advantageous and permit an efficient conversion of the thermal energy of the hot fluid (exhaust gas) into electrical energy. The silicides are, in particular, binary metallic compounds of silicon, which can be utilized as semiconductors. The Zintl-phases are, in particular, intermetallic compounds between highly electropositive alkali metals or earth alkali metals and moderately electronegative elements from the 13th to 16th groups of the periodic table. Some Zintl-phases are diamagnetic semiconductors having a conductivity which rises with increasing temperature, by contrast to metallic conductors.

In accordance with a further advantageous feature of the device of the invention, the inner shell tube and/or the outer shell tube has a structuring which runs in the axial direction and which, in a circumferential direction, alternately forms cross-sectional narrowings and cross-sectional widenings in the intermediate space. The cross-sectional widenings form in each case one flow path. The structuring is, in particular, of undulating form, preferably a sinusoidal structuring. In particular, the cross-sectional narrowings do not separate the individual flow paths, so that a (limited) exchange of fluid is possible between flow paths which are adjacent in the circumferential direction. An at least partial separation of the flow paths by the cross-sectional narrowings, however, likewise conforms to the invention.

In particular, the inner shell tube and the outer shell tube are provided with a structuring, wherein the structurings are oriented relative to one another in such a way that the two shell tubes move closer together or further apart from one another in each case along a circumferential direction, so that cross-sectional narrowings and cross-sectional widenings are formed. In particular, the ratio of the greatest width of the cross-sectional widening to the smallest width of the cross-sectional narrowing (greatest width/smallest width) has a value of at least 2, preferably of at least 3, and particularly preferably of at least 5.

In particular, the outer shell tube and/or the inner shell tube is disposed at a (smallest) spacing of 2 to 7 mm [millimeters] from an outer surface of a heat exchanger tube. That spacing results in an advantageous distribution of the fluid stream over the available outer surface of the heat exchanger tubes. The structuring of the outer shell tube and/or of the inner shell tube has the effect, in particular, that the exhaust gas is conducted past the heat exchanger tubes in close proximity thereto. In particular, the heat exchanger tubes have a greatest diameter of 25 to 35 mm [millimeters], in particular of up to at most 30 mm. In particular, the heat exchanger tubes are spaced apart from one another at a distance between the outer surfaces in the circumferential direction of 4 to 14 mm [millimeters].

In accordance with an added feature of the invention, guide elements which can effect a diversion of the fluid/exhaust gas are disposed at least on one heat exchanger tube and/or at least in one flow path. The guide elements are, in particular, at least partially fastened to the inner shell tube and/or to the outer shell tube. The guide elements serve, in particular, to divert the fluid around the heat exchanger tube and/or to mix the fluid between adjacent heat exchanger tubes and/or to divert the fluid at least partially to an adjacent heat exchanger tube.

In a further refinement, at least one heat exchanger tube and/or at least one guide element and/or the inner shell tube and/or the outer shell tube are/is equipped with structures for generating turbulence in the fluid flow. The structures may be formed by an increased roughness and/or by microstructures. The structures generate turbulence within the fluid stream around the heat exchanger tube, in such a way that a transfer of heat from the fluid stream to the heat exchanger tube is improved. In this way, an increased amount of heat energy is extracted from the fluid stream and dissipated through the heat exchanger tubes. In this way, more efficient use of the heat exchanger or of the thermoelectric generator is possible in this case. In particular, all of the heat exchanger tubes and/or guide elements have structures of that type.

In particular, the structures are disposed on the heat exchanger tube and on the guide element and on the inner and outer shell tubes and are coordinated with one another with regard to their positioning and their effect on the flow.

In particular, the microstructures are constructed in the form of pimples or knobs and/or indentations. The pimples or knobs extend outward proceeding from the surface of the guide element/heat exchanger tube/shell tube, and the indentations extend inward.

In particular, the structures are formed by an increased roughness. In this case, the roughness of that surface of the heat exchanger tube which faces toward the fluid stream is increased in relation to the roughness on that surface of the heat exchanger tube which faces toward the thermoelectric elements or the cooling fluid. In this case, the roughness of that surface of the inner and/or outer shell tube which faces toward the heat exchanger tubes is increased in relation to the roughness on that surface of the inner and/or outer shell tube which faces away from the heat exchanger tubes. In particular, the increased roughness on the heat exchanger tubes and/or on the inner and/or the outer shell tube is increased by a factor of at least 5, preferably of at least 10 and particularly preferably of at least 20. The roughness is determined as a mean roughness Ra or an averaged roughness depth Rz. The methods for determining the characteristic roughness values are known to a person skilled in the art from international standards, for example from DIN (German Industry Standard) EN ISO 4287.

In particular, the bypass has no structures for increasing the turbulence. In particular, the bypass also has no guide elements.

In accordance with another advantageous feature of the invention, the heat exchanger tubes extend in an axial direction beyond the first duct and/or beyond the second duct. The heat exchanger tubes are connected through at least one (common) port to a coolant supply. The port includes, in particular, a feed line and a return line, in such a way that a cooling fluid can circulate between the heat exchanger tubes and a coolant device. In particular, the heat exchanger tubes are disposed on at least one common closure plate which permits the distribution of the cooling fluid to the individual heat exchanger tubes from one port. In this case, it is also possible for one closure plate to be disposed on the first end side and another closure plate to be disposed on the second end side, in such a way that the cooling fluid flows through all of the heat exchanger tubes in one axial direction.

In the heat exchanger, it is possible, in particular, for a honeycomb body through which the fluid can flow radially to be disposed within the first duct. The honeycomb body is, in particular, catalytically coated. The honeycomb body has a centrally disposed inflow duct which is formed so as to be open toward the inlet. The fluid consequently flows through the inlet into the inflow duct and is conducted onward into the intermediate space through the radially running flow ducts or channels of the honeycomb body.

With the objects of the invention in view, there is concomitantly provided a motor vehicle, comprising an internal combustion engine, an exhaust-gas treatment device and a device according to the invention disposed in an exhaust line, wherein the fluid is an exhaust gas of the internal combustion engine. In particular, it is self-evidently possible for multiple devices to be provided in a single-strand or in a multi-strand exhaust line.

The device may also be installed retroactively in an exhaust line, in which case it is necessary merely to provide a connection to a coolant supply. If appropriate, a connection to a control unit is also necessary in order to realize corresponding actuation of a provided bypass.

Other features which are considered as characteristic for the invention are set forth in the appended claims, noting that the features specified individually in the claims may be combined with one another in any desired technologically expedient manner and form further embodiments of the invention. The description, in particular in conjunction with the figures, explains the invention further and specifies supplementary exemplary embodiments of the invention.

Although the invention is illustrated and described herein as embodied in a device having a heat exchanger for a thermoelectric generator of a motor vehicle and a motor vehicle having the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
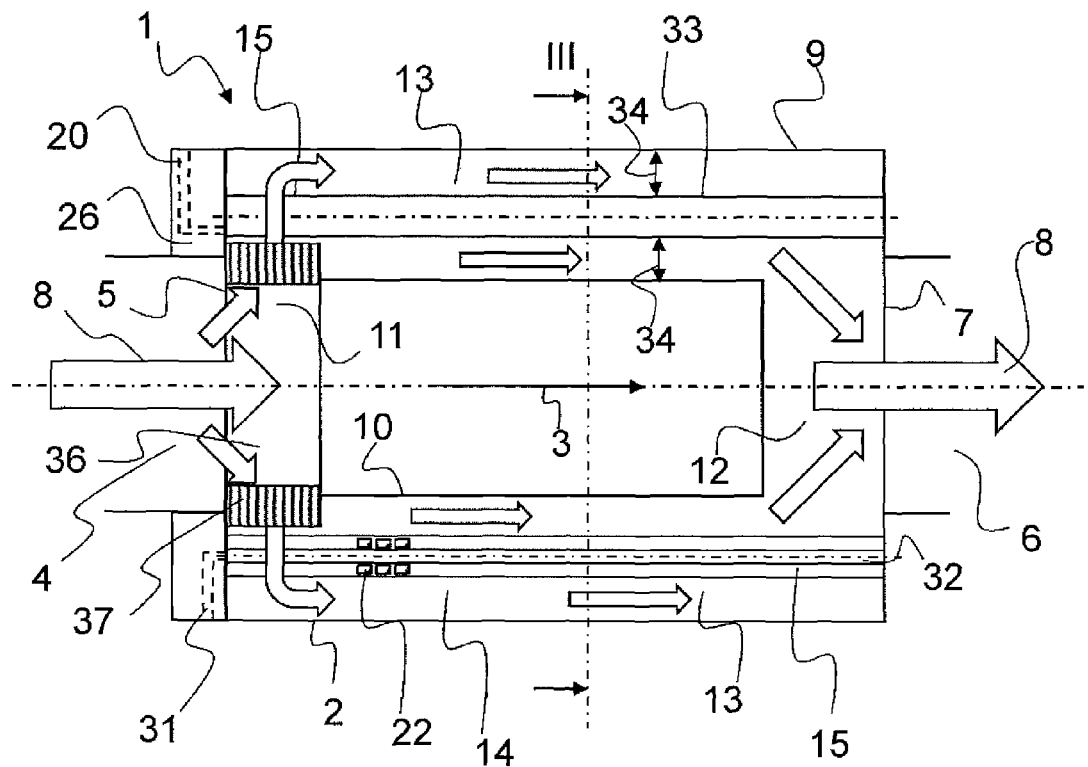
FIG. 1 is a diagrammatic, longitudinal-sectional view of a device with a heat exchanger.

Referring now in detail to the figures of the drawing for explaining the invention and the technical field in more detail by showing particularly preferred structural variants to which the invention is not restricted, and first, particularly, to FIG. 1 thereof, there is seen a longitudinal section of a device having a heat exchanger 1. A fluid 8 (or exhaust gas) flows through an inlet 4 at a first end side 5 and through an inflow duct 36, which is connected in terms of flow or fluidically to the inlet 4, into a honeycomb body 37 through which a flow can pass radially. The honeycomb body 37 is disposed in an annular first duct 11. The fluid 8 flows in the radial direction through the honeycomb body 37 through which the flow can pass radially, and the fluid enters an intermediate space 14 which is formed by an outer shell tube 9 and by an inner shell tube 10. In the intermediate space 14, the fluid 8 is diverted again into an axial direction 3 and flows through the intermediate space 14 in the direction of an outlet 6. In FIG. 1, the intermediate space 14 has a cylindrical construction in the axial direction 3. A conical construction is correspondingly also possible, for example by virtue of the intermediate space 14 widening along the axial direction 3.

The fluid 8 flows in the axial direction 3 along a multiplicity of flow paths 13, which are formed around heat exchanger tubes 15, to a second duct 12. In the second duct 12, the fluid 8 is collected and conducted onward to the outlet 6 at a second end side 7. The heat exchanger tubes 15 extend in the axial direction 3 through the entire intermediate space 14. The fluid 8 flows over an outer surface 33 of the heat exchanger tubes 15. A "hot side" is thus formed there. The heat exchanger tubes 15 have an inner duct 32 through which they are traversed by a cooling fluid 31. Thermoelectric elements 22 which, in particular, have an annular form, are disposed between the inner duct 32 ("cold side") and the outer surface 33 ("hot side"). The device together with the thermoelectric elements 22 forms a thermoelectric generator. The hot fluid 8 (exhaust gas) flows around the outer surface 33 of the heat exchanger tubes 15, in such a way that a temperature potential is generated between the cold side and the hot side. The temperature potential is converted by the thermoelectric elements 22 into electrical energy.

The heat exchanger tubes 15 are disposed in the flow paths 13 which are each formed by the inner shell tube 10 and the outer shell tube 9. In this case, the outer shell tube 9 at least partially forms a housing 2. The outer shell tube 9 and the inner shell tube 10 are each disposed at a respective spacing 34 from the outer surface 33 of the heat exchanger tube 15.

A closure plate 26 is provided on the housing 2 in the region of the inlet 4 or of the first end side 5. The closure plate 26 serves firstly for delimiting the intermediate space 14 in the axial direction 3 and secondly for receiving the heat exchanger tubes 15, in such a way that the cooling fluid 31 which flows through the heat exchanger tube 15 is supplied and discharged therein. A port 20 for connection to a coolant supply is disposed in the closure plate 26. The heat exchanger tubes 15 extend through the intermediate space 14 from the closure plate 26 to the second end side 7. There, a diversion is provided which causes the cooling fluid 31 to be returned to the closure plate 26 through a further heat exchanger tube 15. At the same time, non-illustrated electrical terminals may be provided in the closure plate 26 in such a way that an electrical current generated as a result of the temperature difference between the hot fluid 8 and cold cooling fluid 31 within the heat exchanger tubes 15 can be output to the motor vehicle, due to the configuration of thermoelectric elements 22 within the heat exchanger tubes 15.

Figure 2:
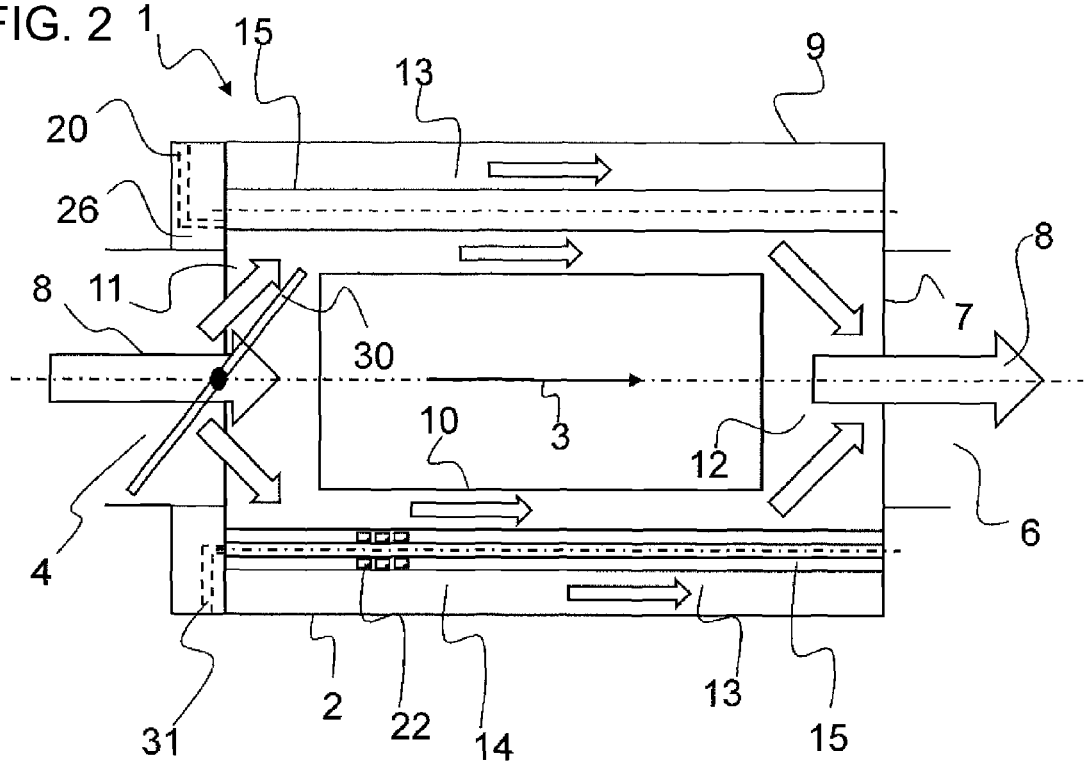
FIG. 2 is a longitudinal-sectional view of a further structural variant of a device with a heat exchanger.

FIG. 2 shows a further structural variant of a device with a heat exchanger 1 in a longitudinal section. In the figures, the same reference signs are used for identical objects. A control element 30, which is indicated in the region of the inlet 4, can divert the fluid stream into a bypass. A bypass is formed by a flow path 13 in which no heat exchanger tube 15 is disposed (not shown therein).

Figure 3:
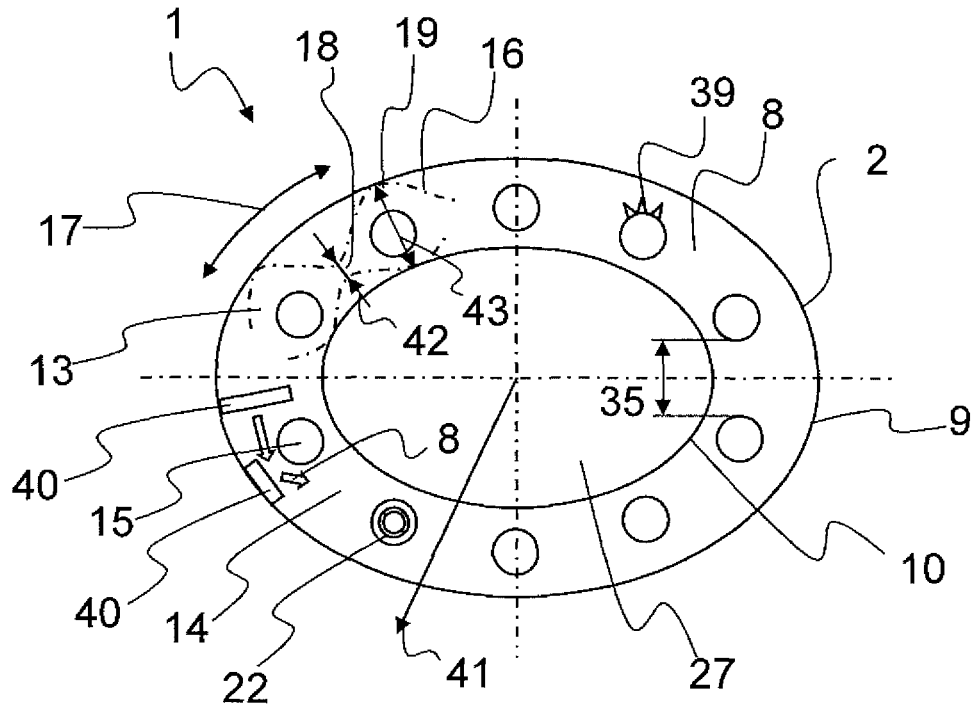
FIG. 3 is a cross-sectional view taken along a line III of FIG. 1 in the direction of the arrows.

FIG. 3 shows the device with the heat exchanger 1 according to FIG. 1 in a cross section which is taken along a section axis (III) shown in FIG. 1. In this case, the housing 2 is formed by the outer shell tube 9 and surrounds the intermediate space 14 and the inner shell tube 10. Heat exchanger tubes 15 are disposed in the intermediate space 14. The intermediate space 14 is annular and is delimited to the inside by the inner shell tube 10. The inner shell tube 10 surrounds a cavity 27. In the intermediate space 14 there is formed a multiplicity of flow paths 13 along which the fluid 8 can flow through the intermediate space 14. Structures 39, which are shown on one heat exchanger tube 15, serve for generating turbulence in the fluid stream. The heat transfer between the fluid 8 and heat exchanger tubes 15 can be improved by using the structures 39.

One heat exchanger tube 15, which is illustrated in detail in cross section in the lower part of FIG. 3 in this case, shows the annular thermoelectric elements 22 within the heat exchanger tube 15. The heat exchanger tubes 15 are disposed at a distance 35 from one another in a circumferential direction 17.

A structuring 16 of the outer shell tube 9 and of the inner shell tube 10 is indicated in dashed lines in the left-hand upper half of FIG. 3. As a result of the structuring 16, cross-sectional narrowings 18 and cross-sectional widenings 19 in the intermediate space 14 are formed in the circumferential direction 17. An exchange of fluid 8 through the cross-sectional narrowings 18 is possible in the circumferential direction 17 between flow paths 13 located in adjacent cross-sectional widenings 19. The narrowest point of the cross-sectional narrowing 18 has a smallest width 42. The widest point of the cross-sectional widening 19 has a greatest width 43.

Guide elements 40, which at least partially divert the fluid 8, are also shown in FIG. 3. Through the use of the guide elements 40, the fluid 8 is guided around the individual heat exchanger tubes 15 in such a way that the fluid 8 flows not only in the axial direction 3 but at least partially also in the circumferential direction 17 and/or in a radial direction 41.

Figure 4:
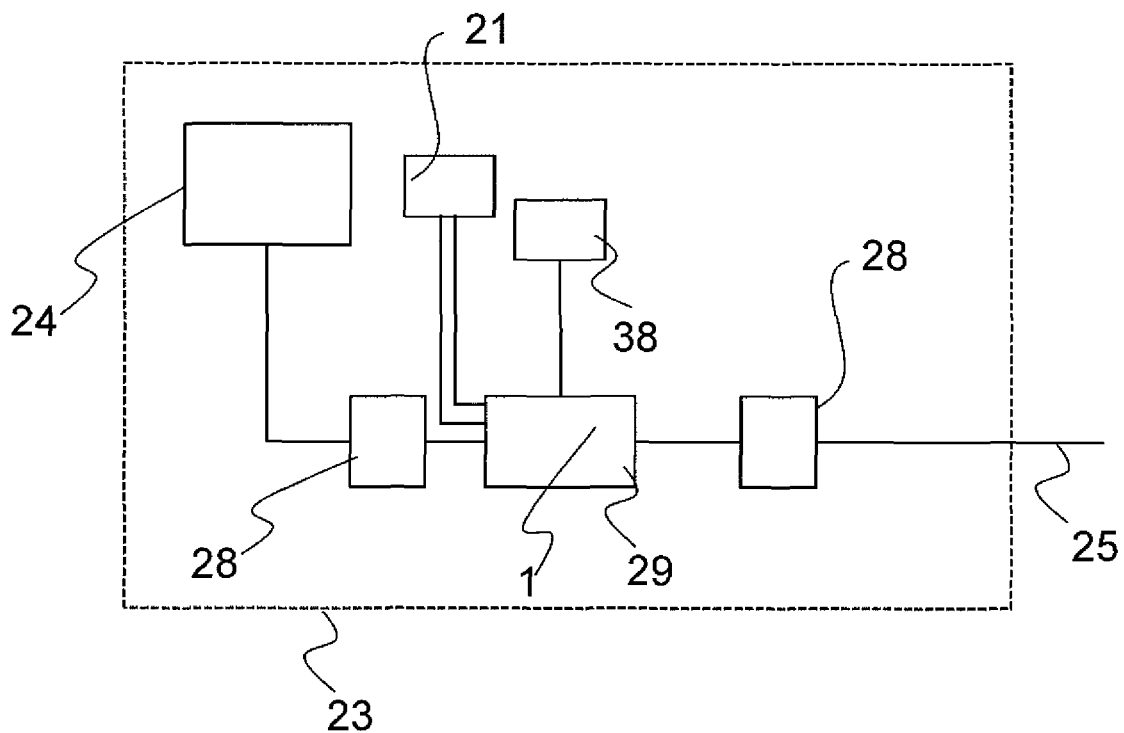
FIG. 4 is a block diagram of an exemplary configuration of a device of this type in a motor vehicle.

FIG. 4 shows a configuration of the device with the heat exchanger 1 within a motor vehicle 23. The motor vehicle 23 has an internal combustion engine 24 with an exhaust line 25 and further exhaust-gas treatment components 28. The heat exchanger 1 in this case is in the form of a thermoelectric generator 29, in which the heat exchanger tubes disposed in the thermoelectric generator 29 are connected through a feed line and a return line to a coolant supply 21. A regulating unit 38 serves, inter alia, for the actuation of the control element within the heat exchanger 1 in such a way that the amount of exhaust gas flowing through the bypass can be controlled. In this way, the exhaust gas can be conducted past the heat exchanger tubes and past the thermoelectric elements in such a way that, if appropriate, no additional burden is placed on the coolant supply 21 of the internal combustion engine 24 by the exhaust gas in the thermoelectric generator 29.

Other configurations or structural variants of the invention are possible. In particular, it is possible for multiple closure plates 26 to be disposed within the housing 2 in such a way that the heat exchanger tubes 15 are held not only at one end but also at another end. It is thus also possible for ports 20 to be disposed in separate respective closure plates 26 in such a way that the flow passes through the heat exchanger tubes 15 only in one axial direction 3. In the figures described herein, a cooling fluid 31 flows through the heat exchanger tubes 15 in an axial direction 3 from the closure plate 26 in the vicinity of the inlet 4 to the second end side 7 and back to the closure plate 26. In particular, the closure plate 26 may also be disposed on the second end side 7 of the device.

It likewise falls within the scope of the invention for a bypass for the fluid 8 to be formed by the cavity 27. The bypass is then formed so as to be open toward the inlet 4 and toward the outlet 6 in such a way that the fluid 8 can flow through the cavity 27. The bypass may then be formed, in particular, by a flap as a control element 30 which is disposed within the cavity 27. As a result of the opening of the flap, at least a major part of the fluid 8 is conducted through the cavity 27, because it is there that the lowest flow resistance prevails (in relation to the fluid being conducted through the flow paths 13). In this case, the inner shell tube 10 is formed at least partially without a structuring 16 so that the control element 30 can sealingly close off the cavity 27 at the inner shell tube 10.

The invention claimed is:

1. A device having a heat exchanger, the device comprising:
   a housing having an axial direction, first and second end sides disposed along said axial direction, an inlet at said first end side and an outlet at said second end side for a fluid, an annular first duct adjoining said inlet and an annular second duct upstream of said outlet;
   at least one outer shell tube and at least one inner shell tube disposed mutually concentrically and defining an intermediate space therebetween;
   a multiplicity of flow paths for the fluid extending in said axial direction in said intermediate space and interconnecting said first and second ducts;
   at least one respective heat exchanger tube disposed in each of said multiplicity of flow paths; and
   thermoelectric elements disposed in said heat exchanger tubes;
   said inlet and outlet, said first and second ducts and said multiplicity of flow paths configured to cause the fluid to flow through said inlet, into said first duct, subsequently through said multiplicity of flow paths, into said second duct and out of said housing through said outlet.

2. A motor vehicle, comprising:
   an internal combustion engine emitting an exhaust gas as a fluid;

an exhaust line receiving the exhaust gas from said internal combustion engine; and a device having a heat exchanger according to claim 1 being disposed in said exhaust line.

3. A device having a heat exchanger, the device comprising:
- a housing having an axial direction, first and second end sides disposed along said axial direction, an inlet at said first end side and an outlet at said second end side for a fluid, an annular first duct adjoining said inlet and an annular second duct upstream of said outlet;
- at least one outer shell tube and at least one inner shell tube disposed mutually concentrically and defining an intermediate space therebetween;
- a multiplicity of flow paths for the fluid extending in said axial direction in said intermediate space and interconnecting said first and second ducts;
- at least one of said inner shell tube or said outer shell tube having a structuring extending in said axial direction and alternately forming cross-sectional narrowings and cross-sectional widenings in said intermediate space in a circumferential direction, said cross-sectional widenings each forming a respective one of said flow paths; and
- at least one respective heat exchanger tube disposed in each of said multiplicity of flow paths;
- said inlet and outlet, said first and second ducts and said multiplicity of flow paths configured to cause the fluid to flow through said inlet, into said first duct, subsequently through said multiplicity of flow paths, into said second duct and out of said housing through said outlet.

4. The device according to claim 3, which further comprises guides disposed in said flow paths and configured to divert the fluid.

5. A motor vehicle, comprising:
- an internal combustion engine emitting an exhaust gas as a fluid;
- an exhaust line receiving the exhaust gas from said internal combustion engine; and
- a device having a heat exchanger according to claim 3 being disposed in said exhaust line.

6. A device having a heat exchanger, the device comprising:
- a housing having an axial direction, first and second end sides disposed along said axial direction, an inlet at said first end side and an outlet at said second end side for a fluid, an annular first duct adjoining said inlet and an annular second duct upstream of said outlet;
- at least one outer shell tube and at least one inner shell tube disposed mutually concentrically and defining an intermediate space therebetween;
- a multiplicity of flow paths for the fluid extending in said axial direction in said intermediate space and interconnecting said first and second ducts;
- a coolant supply outside said housing; and
- at least one respective heat exchanger tube disposed in each of said multiplicity of flow paths, said heat exchanger tubes extending in said axial direction beyond at least one of said first or second ducts and being connected through at least one port to said coolant supply;
- said inlet and outlet, said first and second ducts and said multiplicity of flow paths configured to cause the fluid to flow through said inlet, into said first duct, subsequently through said multiplicity of flow paths, into said second duct and out of said housing through said outlet.

7. A motor vehicle, comprising:
- an internal combustion engine emitting an exhaust gas as a fluid;
- an exhaust line receiving the exhaust gas from said internal combustion engine; and
- a device having a heat exchanger according to claim 6 being disposed in said exhaust line.

\* \* \* \* \*